United States Patent [19]

Cuomo et al.

[11] Patent Number: 5,280,154
[45] Date of Patent: Jan. 18, 1994

[54] RADIO FREQUENCY INDUCTION PLASMA PROCESSING SYSTEM UTILIZING A UNIFORM FIELD COIL

[75] Inventors: Jerome J. Cuomo, Lincolndale; Charles R. Guarnieri, Somers; Jeffrey A. Hopwood, Brewster; Stanley J. Whitehair, Peekskill, all of N.Y.

[73] Assignee: International Business Machines Corporation, Armonk, N.Y.

[21] Appl. No.: 828,060

[22] Filed: Jan. 30, 1992

[51] Int. Cl.$^5$ .............................................. B23K 9/00
[52] U.S. Cl. ........................ 219/121.52; 219/121.43; 219/121.41; 204/298.31; 156/345; 156/646
[58] Field of Search ........... 219/121.4, 121.43, 121.36; 156/646, 643, 345; 204/298.2, 298.19, 298.37

[56] References Cited

U.S. PATENT DOCUMENTS

| | | | |
|---|---|---|---|
| 3,705,091 | 12/1972 | Jacob | 204/312 |
| 4,361,749 | 11/1982 | Lord | 219/121.43 |
| 4,386,258 | 5/1983 | Akashi et al. | 219/121 PM |
| 4,431,898 | 2/1984 | Reinberg et al. | 219/121 |
| 4,609,810 | 9/1986 | O'Brien et al. | 219/121 |
| 4,629,887 | 12/1986 | Bernier | 250/251 |
| 4,629,940 | 12/1986 | Gagne et al. | 315/111.51 |
| 4,686,113 | 8/1987 | Delfino et al. | 427/45.1 |
| 4,810,935 | 3/1989 | Boswell et al. | 315/111.41 |
| 4,812,702 | 3/1989 | Anderson | 313/153 |
| 4,887,005 | 12/1989 | Rough et al. | 315/111.21 |
| 4,894,510 | 1/1990 | Nakanishi et al. | 219/121.43 |
| 4,894,590 | 1/1990 | Witting | 315/248 |
| 4,894,591 | 1/1990 | Witting | 315/248 |
| 4,902,870 | 2/1990 | Frind et al. | 219/121.52 |
| 4,906,582 | 3/1990 | Fukui et al. | 436/153 |
| 4,948,458 | 8/1990 | Ogle | 156/634 |
| 4,973,381 | 11/1990 | Palmer | 156/643 |
| 4,990,229 | 2/1991 | Campbell et al. | 204/298.06 |
| 4,999,215 | 3/1991 | Akagi et al. | 427/41 |
| 5,017,751 | 5/1991 | Brecher et al. | 219/121.52 |
| 5,036,252 | 7/1991 | Lob | 315/111.31 |
| 5,146,137 | 9/1992 | Gesche et al. | 315/111.21 |

FOREIGN PATENT DOCUMENTS

| | | |
|---|---|---|
| 0203560 | 5/1986 | European Pat. Off. . |
| 0261922 | 9/1987 | European Pat. Off. . |
| 0284867 | 3/1988 | European Pat. Off. . |
| 0184812 | 12/1989 | European Pat. Off. . |
| 0379828 | 12/1989 | European Pat. Off. . |
| 434932A2 | 2/1990 | European Pat. Off. . |
| 2231197A | 7/1990 | United Kingdom . |

OTHER PUBLICATIONS

"Development of rf plasma generators for neutral beams" M. C. Vella et al. J. Vac. Sci. Technol A. vol. 3, No. 3 May/Jun. 1985 pp. 1219-1221.

Primary Examiner—Mark H. Paschall
Attorney, Agent, or Firm—Jeffrey L. Brandt

[57] ABSTRACT

A plasma processing apparatus comprising: a chamber for supporting a workpiece; an inlet for introducing a gas into the chamber; a coil of conductive material having a generally flattened configuration whereby to provide a at least one generally planar surface defined by parallel conductors disposed on the chamber; and apparatus for applying radio frequency energy to the coil.

12 Claims, 4 Drawing Sheets

RADIO FREQUENCY INDUCTION PLASMA PROCESSING SYSTEM UTILIZING A UNIFORM FIELD COIL

CROSS REFERENCE TO RELATED APPLICATIONS

The present application is related to Ser. No. 301,933 now abandoned, titled "RADIO FREQUENCY INDUCTION/MULTIPOLE PLASMA PROCESSING TOOL," filed Jan. 25, 1989 by Coultas, D. K., and Keller, J. H.

FIELD OF THE INVENTION

The present invention relates generally to a process and apparatus for generating a plasma, and more particularly to a radio frequency induction (RFI) plasma processing system utilizing a shaped coil to produce a highly uniform plasma.

DISCUSSION OF RELATED ART

Plasma processing is used in a variety of semiconductor device manufacturing processes, including etching, deposition, resist stripping, passivation, and the like. As semiconductor devices includes more and smaller features, the resolution required of such processing increases. High plasma density and uniformity are required to produce high resolution features.

Generally, plasmas are produced from low-pressure process gases by inducing electron flows which ionize individual gas molecules, through the transfer of kinetic energy, via individual electron-gas molecule collisions. Most commonly, this plasma production is accomplished by accelerating electrons in an electric field, typically a radio-frequency electric field, produced between a pair of opposed electrodes oriented parallel to a wafer to be processed. See U.S. Pat. No. 4,887,005 to Rough et al., for an example of such a system.

The use of an electric field normal to a wafer, however, does not provide efficient conversion of the RF energy to the plasma, especially at low frequencies and gas pressures. Therefore, other methods have been developed for increasing the efficiency of plasma generation.

One class of plasma processing systems uses a plasma generating region or chamber connected to but separate from a wafer processing chamber or region. In such systems, the process gas is acted on in the plasma generating region so as to produce a nonuniform plasma. This nonuniform plasma is further acted upon, typically by flowing and acceleration, to provide uniformity before it is applied to the wafer.

Such plasma processing systems use a variety of techniques to act on the process gas and provide a plasma, including RFI, electron cyclotron resonance (ECR), helical resonators, and helical wave sources. These systems tend to be relatively large and complex in construction. Some efficiency is necessarily lost in forcing the uniformity of the plasma, and high uniformity is very difficult to achieve. Examples of such systems are set out immediately below.

U.S. Pat. No. 4,894,510 to Nakanishi et al. shows an ECR plasma processing system using a complex coil assembly to generate a rotating magnetostatic field whereby to try to obtain uniformity of the plasma.

U.S. Pat. No. 4,990,229 to Campbell et al. shows a plasma processing system which uses helicon or whistler waves, excited by a special loop antenna, to generate a plasma. Magnets are recommended to control the uniformity of the plasma.

U.S. Pat. No. 4,810,935 to Boswell shows a helicon wave plasma processing system wherein an antenna is used to couple radio frequency energy into a plasma generation chamber. Electromagnets are used in the plasma generation chamber and in the wafer processing chamber to accelerate the plasma towards the wafer.

The above-described, multi-chamber plasma processing systems suffer from the disadvantages of being relatively large, complex in construction, and costly to manufacture and maintain. Further, efficiency is lost in attempting to achieve uniformity of the plasma.

Another class of plasma processing systems utilizes a coil disposed about the periphery of a reaction chamber for coupling RF energy into the chamber. The wafer or workpiece being processed is contained within the reaction chamber. See, for example, U.S. Pat. Nos. 3,705,091 to Jacob and 4,686,113 to Delfino et al. These systems have an inherent problem with uniformity of the plasma, as the RF energy is distributed about the periphery of the plasma.

Recently there have been developed RFI plasma processing systems wherein the RF energy is coupled directly into a wafer processing chamber via a planar, spiral coil. European Patent Application 0 379 828 by Coultas et al. (assigned to the present assignee) shows such a system wherein a spiral coil 22 is disposed on top of a chamber 10 containing a wafer 11. Coil 22 is situated generally parallel to the plane of wafer 11, and spaced relatively close thereto: i.e. within a distance of tens of centimeters. Multipole magnets are disposed about the periphery of chamber 10 for the purpose of containing the plasma, whereby to increase the density and uniformity of the plasma. Coil 22 is typically driven at a frequency of about 13 MHz, and plasma can be formed at very low pressures: i.e. in the range of 1-5 mTorr.

U.S. Pat. No. 4,984,458 to Ogle shows a system similar to that shown in Coultas et al. described above, with the exception that Ogle does not include the use of the magnets.

While the Coultas et al. and Ogle systems represent substantial contributions in the art of plasma processing systems, they are not without their drawbacks. More specifically, the uniformity and densitu of the plasma generated by the Ogle system are not as good as is desirable for processing very small features. This is because the spiral shape of the coil results in a nonuniform electromagnetic field and hence nonuniform plasma both towards the center and about the periphery of the chamber. While Coultas et al. uses magnets to increase the density and the uniformity of the plasma, the magnets themselves increase the cost and complexity of the system, and may also complicate wafer handling, particularly those steps relating to placing and removing the wafer from inside the chamber.

It would be most desirable to provide a plasma processing system having the relative simplicity of construction of the Ogle and Coultas et al. systems, and the high plasma density and uniformity of the Coultas et al. system, but which does not require the magnets shown and described in the Coultas et al. system. Such a plasma processing system would represent a substantial improvement over plasma processing systems of the types discussed above.

OBJECTS OF THE INVENTION

An object of the present invention is to provide a new and improved plasma processing system.

Another object of the present invention is to provide a new and improved plasma processing system which is relatively simple in construction in comparison to the multiple chamber systems known in the art.

A further object of the present invention is to provide a new and improved plasma processing system which produces a highly dense and uniform plasma at relatively low pressures.

Yet another object of the present invention is to provide a new and improved plasma processing system which does not require the use of complex magnets or other mechanisms to control the uniformity and density of the plasma.

SUMMARY OF THE INVENTION

In accordance with one aspect of the present invention, there is provided a plasma processing apparatus comprising: a chamber for supporting a workpiece in a controlled-pressure environment; means for introducing a gas into the chamber; a coil of conductive material disposed on the chamber and including at least one generally flattened surface defined by parallel conductors; and means for applying radio frequency energy to the coil.

In accordance with another aspect of the present invention, there is provided a method of operating a plasma processing apparatus, the apparatus comprising a chamber for supporting a workpiece in a vacuum, and means for introducing a gas into the chamber, the method comprising the steps of: providing a coil of conductive material including at least one generally flattened surface defined by parallel conductors disposed on the chamber; and applying radio frequency energy to the coil.

BRIEF DESCRIPTION OF THE DRAWINGS

These and other objects, features, and advantages of the present invention will become apparent upon a consideration of the following Detailed Description of the Invention when considered with the drawing Figures, in which.

DESCRIPTION OF THE INVENTION

Figure 1:
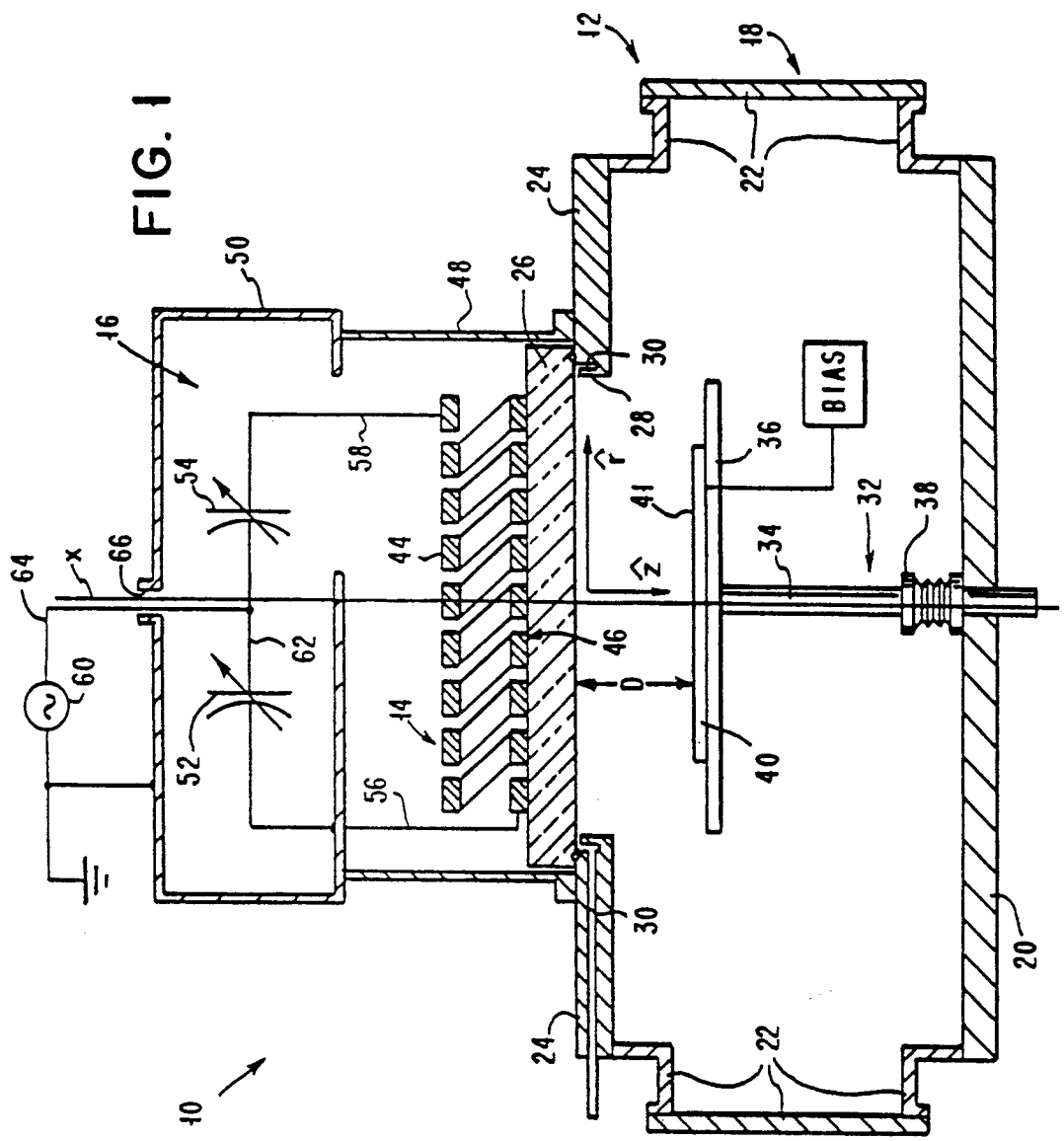
FIG. 1 is a front view, partly in cross-section, of a plasma processing chamber constructed in accordance with the present invention.

Refering now to the drawing Figures, FIG. 1 shows an RFI plasma processing system 10 generally including a wafer processing chamber 12, an RFI coil 14, and a matching circuit 16.

Describing processing chamber 12, the chamber comprises a generally rectangular, metal shell 18 including a bottom 20, sides 22, and an upper flange 24. A dielectric vacuum window 26, for example quartz, spans an aperture 28 in flange 24, completing chamber 12 such that the chamber is capable of sustaining very high vacuums within. An aperture or inlet 30 extends through flange 24 and around the periphery of aperture 28 for admitting a gas into the interior of chamber 12.

Appropriate valving is provided (not shown) in a manner well known in the art for controlling the admission of a gas through inlet 30 into chamber 12. Similarly, an appropriate outlet (not shown) and valving and pumps (also not shown) are provided both for drawing a vacuum inside of chamber 12, and for purging gas from the interior of the chamber. One exemplary embodiment of shell 18 measures 27 cm in length, by 27 cm in width, by 12 cm in height.

Disposed generally centrally within chamber 12 and underneath of quartz window 26 is a wafer support assembly 32 including a support rod 34 extending along a vertical axis X, and a support platform 36 set on the end of rod 34 and disposed in a plane generally perpendicular to axis X. Support rod 34 extends through bottom 20 of shell 18 via an appropriate vacuum seal 38. A wafer 40 is supported on the upper surface of platform 36. Wafer 40 comprises, for example, a rectangular, glass-ceramic substrate having a major upper surface 41 disposed parallel to quartz window 26 and spaced therefrom by a distance D in the range of 5–10 cm. Circuit means 43 is included for optionally applying an RF or DC bias to substrate 40 in a manner well known in the art.

Figure 2:
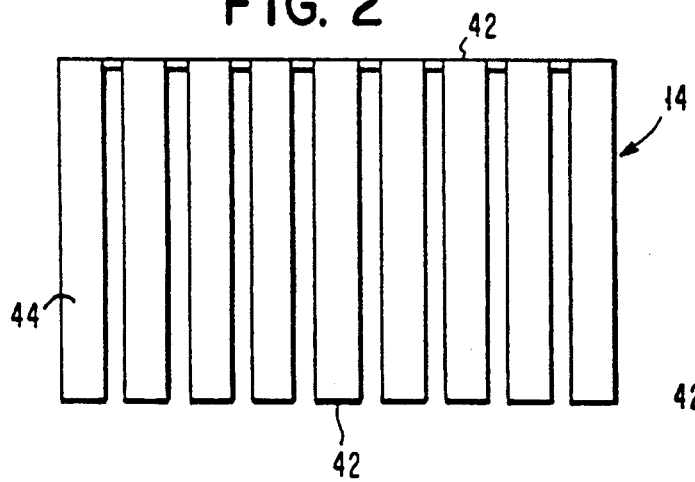
FIGS. 2 and 3 are top and side views, respectively, of RFI coil 14 of FIG. 1.
Figure 3:
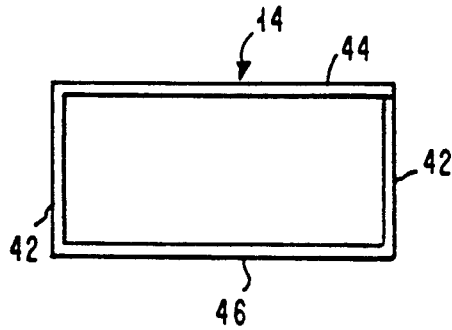

Refering now additionally to FIGS. 2 and 3, coil 14 is seen to be generally rectangular in shape, having squared-off, parallel sides 42, and generally opposing, parallel, planar, upper and lower surfaces 44 and 46. In contrast to the Coultas et al. and Ogle systems discussed above, wherein the coil windings are spiral in configuration, the adjoining windings in upper and lower surfaces 44 and 46 are disposed parallel to one-another. As shown in FIG. 1, coil 14 is positioned with surfaces 44, 46 generally perpendicular to axis X and parallel to upper surface 41 of wafer 40. Upper surface 41 of wafer 40 is thus positioned a distance in the range of about 6–15 cm from bottom surface 46 of coil 14, the exact distance being dependent on the thickness of quartz plate 26.

In one exemplary embodiment, coil 14 comprises copper strap wrapped about a teflon coilform (not shown), the coilform measuring 9.0 inches long, by 9.0 inches wide, by 0.75 inches in thickness.

Continuing with reference to FIG. 1, a rectangular metal frame 48 sets atop flange 24 surrounding coil 14 so as to provide an electromagnetic enclosure for the coil.

Atop metal frame 48 sets a rectangular metal box 50 substantially enclosing a pair of series-connected, variable capacitors 52 and 54. The free electrode of capacitor 52 is connected by an electrical connector 56 to one end of coil 14, to box 50, and to an electrical ground, thereby grounding all of the metal components of shell 18, frame 48, and box 50. Coil 14 is, of course, otherwise insulated from the system ground by its position atop quartz window 26.

The free electrode of capacitor 54 is connected by an electrical connector 58 to the opposite end of coil 14. A source of RF power 60 is connected between system ground and the commonly connected terminals 62 of capacitors 52 and 54 by an electrical connector 64 extending through an aperture 66 in the upper surface of box 50. In a manner well understood by those skilled in the art, the values of capacitors 52, 54 are selected such that the circuit formed with coil 14 is tuned to the frequency generated by source 60. Source 60 is provided so as to operate at a selected frequency in the range of 0.4–40 MHz.

In one exemplary mode of operation wherein system 10 is used to etch by ashing polyimide from glass-ceramic wafer 41, chamber 12 is operated so that oxygen is flowed into the chamber through aperture 30 at a pressure maintained at 5.0 mTorr and a flow rate of 50 standard cc/minute. RF source 60 is operated so as to provide 500 watts of power at a frequency of 13.56 MHz.

The present inventors have determined that, when using a coil of the type shown and described above, the resultant electromagnetic field developed in chamber 12 is highly uniform in a rectangular cross-sectional area generally equivalent in size to and underlying planar surfaces 44, 46 of the coil. Thus, a highly uniform electromagnetic field is developed over the rectangular upper surface of wafer 40. Highly uniform ashing thus results from the process described immediately above.

Figure 11:
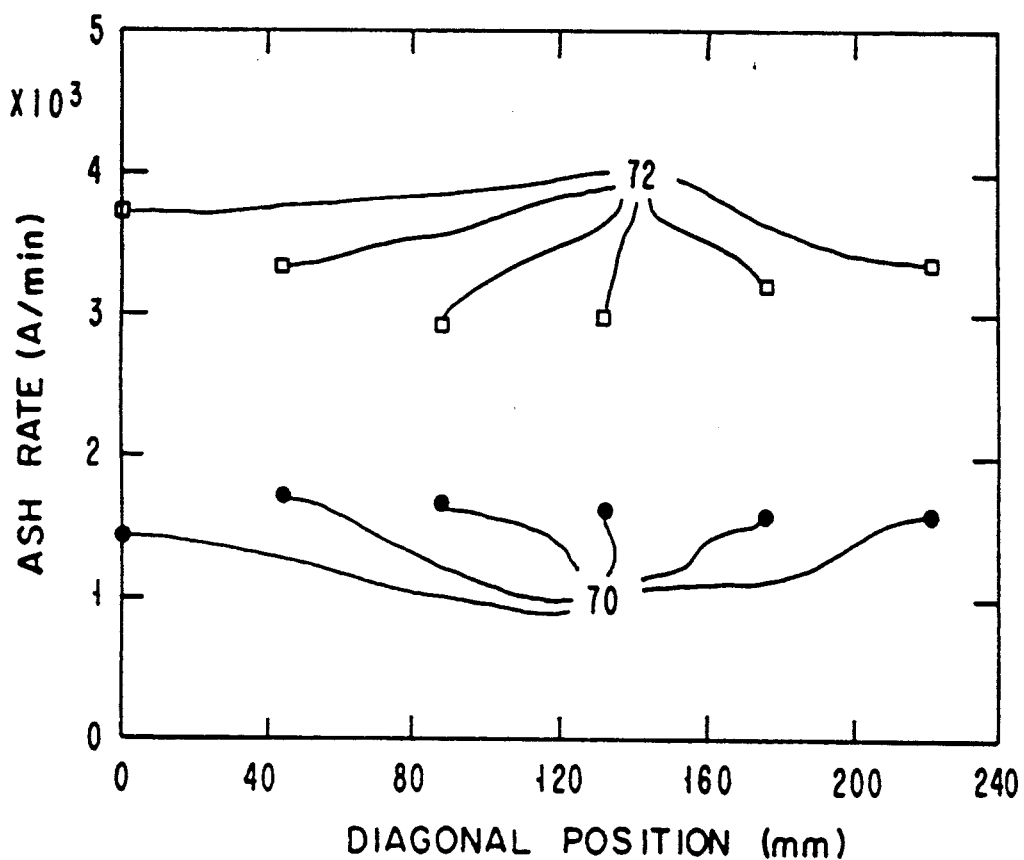
FIG. 11 is a graph showing processing rate versus position on wafer 40 for both a previously known system and the system of the present invention.

With reference to FIG. 11, ash rate in angstroms/minute is shown against diagonal positions on wafer 40 when system 10 is operated as described above. Data points indicated by filled circles 70 represent the system of the present invention, while data points indicated by hollow squares 72 represent a system of the type shown and described in Coultas et al. in the Background of the Invention, above, without the inclusion of magnets. Considering the graph of FIG. 11, it is seen that the present system, while somewhat slower than that of Coultas et al., provides substantially more uniformity across the surface of the wafer being etched. It is thus seen that the system of the present invention provides both increased uniformity and economy of construction.

As is apparent from the ashing results shown in FIG. 11, the plasma density of system 10 is adequate to provide an acceptably high rate of etching without the use of magnets. Other gases may be used to further increase the etching rate, and system power may be increased to achieve the same affect.

It is noted also that, while the system of the present invention performs adequately without magnets, dipole magnets may optionally be included in the present system, in the manner of Coultas et al., to further improve plasma uniformity and density.

Figure 4:
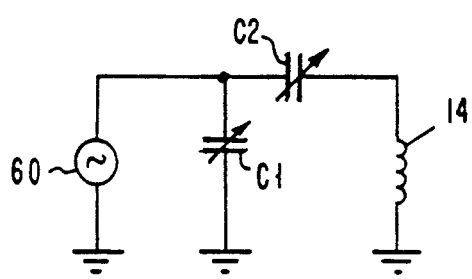
FIGS. 4, 5, and 6 show alternate configurations for the RFI matching circuit 16 of FIG. 1.
Figure 5:
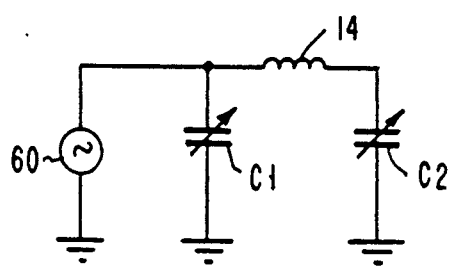
Figure 6:
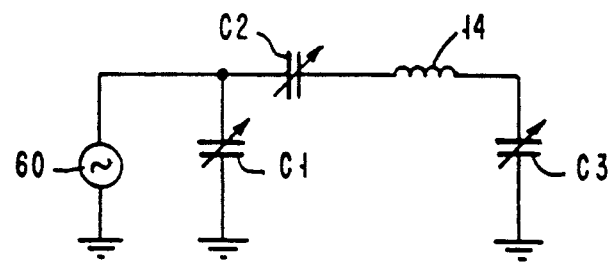

Refering now to FIGS. 4, 5, and 6, FIG. 4 illustrates schematically matching circuit 16 of FIG. 1, while FIGS. 5 and 6 showing alternate embodiments for the matching circuit. Capacitors are indicated as as C1, C2, and C3 (FIG. 6), and coil 14 is shown as an inductor.

In the circuit of FIG. 5, capacitors C1 and C2 are connected between opposite sides of coil 14 and ground. The circuit of FIG. 6 is identical to that of FIG. 4, with the addition of a capacitor C3 between coil 14 and ground. In such configurations, the values of capacitors C1, C2, and C3 (FIG. 6) are selected so that the matching circuit is tuned to the frequency of RF source 60. It will thus be understood by those skilled in the art that many alternative matching circuits, the design and operation of which are well known in the art, can be used to drive coil 14 of the present invention.

The present inventors have determined that the advantages of the invention can be derived from any coil construction featuring at least one flattened surface, including straight, parallel-disposed windings, positioned generally parallel to the processing plane, such as surface 46 of coil 14 above. While it is desirable to have a second, flattened, parallel coil surface including parallel windings whereby to further increase uniformity (i.e. surface 44 of coil 14), it is not necessary to the practice of the present invention. Thus, many different coil configurations are contemplated by the present invention. Examplary, alternate coil constructions are shown in FIGS. 7-10.

Figure 7:
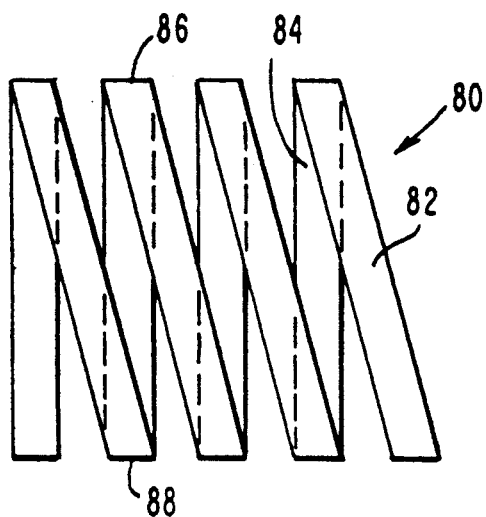
FIGS. 7, 8, and 9 show top, side, and front cross-sectional views, respectively, of an alternate RFI coil configuration.
Figure 8:
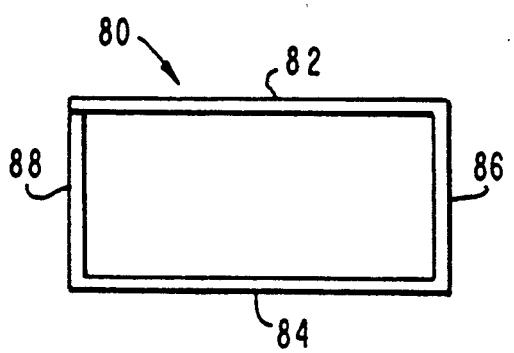
Figure 9:
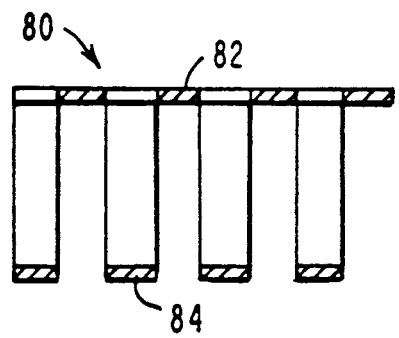

With reference now to FIGS. 7, 8, and 9, there is shown a coil 80 having parallel, helical windings defining major top and bottom surfaces 82, 84, and side surfaces 86, 88. Coil 80 is formed using copper strapping and a coilform of the types described with respect to coil 14 above. Major surfaces 82, 84 are thus planar and mutually parallel, as are the major surfaces of coil 14. Coil 80 further defines a rectangular cross-sectional shape as shown in FIG. 8.

In operation, coil 80 is straight-forwardly substituted for coil 14 in system 10 described above. Having the same general size and shape as coil 14, the system utilizing coil 80 would operate in substantially the identical manner.

Figure 10:
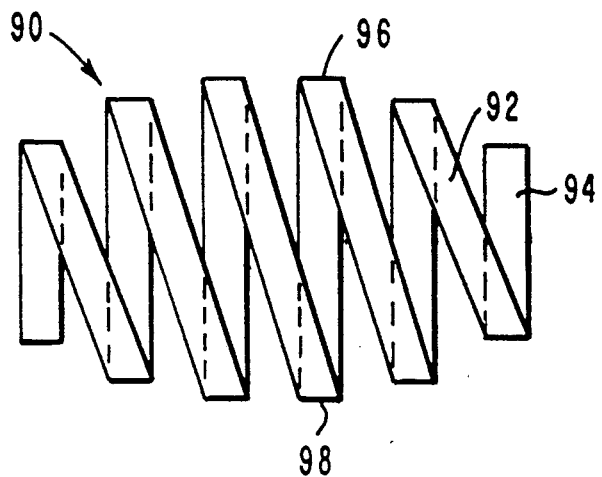
FIG. 10 shows a top view of another alternate RFI coil configuration.

With reference now to FIG. 10, there is shown yet another coil 90 including parallel windings defining major, planar, parallel upper and lower surfaces 92, 94, and parallel sides 96, 98. Coil 90 is formed using the same copper strapping as coils 14 and 80 above, and on substantially the same coilform, the only modification being that the coilform is shaved to provide a generally oblong shape to the major surfaces 92, 94.

In operation, coil 90 is straight-forwardly substituted for coil 14 in system 10 above, and will provide a uniform electromagnetic field within chamber 12 over a region having generally the same cross-sectional shape as surface 92, 94.

It is thus seen that a wide variety of coil shapes are covered by the present invention, the consistent feature amongst them being the flattened, major surface, defined by parallel windings, and positioned within the plasma processing system so as to be parallel to the workpiece being processed, thereby providing a uniform electromagnetic field in the plasma above the workpiece.

It is not necessary to the practice of the present invention that the side surfaces of the coils, for example sides 42 of coil 14 above, be perpendicular to the major surfaces. Thus, coils contemplated by the present invention need not be rectangular in cross-section. Also, the coil need not be wound of strapping or strap-like material, but could comprise any suitable conductor, such as circular cross-section wire.

It will be apparent that the shape of the coil major surfaces can, in accordance with the present invention, be selected to optimize the uniformity of the electromagnetic field over the workpiece being processed. Thus, for a rectangular workpiece such as may be found in a semiconductor package, the coil is formed so as to have at least one rectangular major surface, such as is present in coils 14 and 80 above. For a circular workpiece such as a semiconductor wafer, the coil is formed so as to have at least one circularly shaped major surface. It will thus be apparent that a coil can be shaped to match and thus optimize plasma processing for substantially any workpiece.

The present invention is readily adapted to providing a plasma processing chamber for processing sheet material by providing a coil having an elongate, rectangular shape. In operation, sheet material can be moved through chamber 12 in lieu of wafer 40, the sheet material feeding through the walls of the chamber via appropriate vacuum seals as are well known in the art. Because the coil can be shaped to provide a highly uniform electromagnetic field over a long, rectangular area, such a system constructed in accordance with the present invention would be more uniform and operate over a larger area than previously known systems of the type described in the Background above. Alternatively to providing one elongate, rectangular coil, several shorter rectangular coils can be positioned side-by-side, and driven by in-phase synchronized RF sources.

Figure 12:
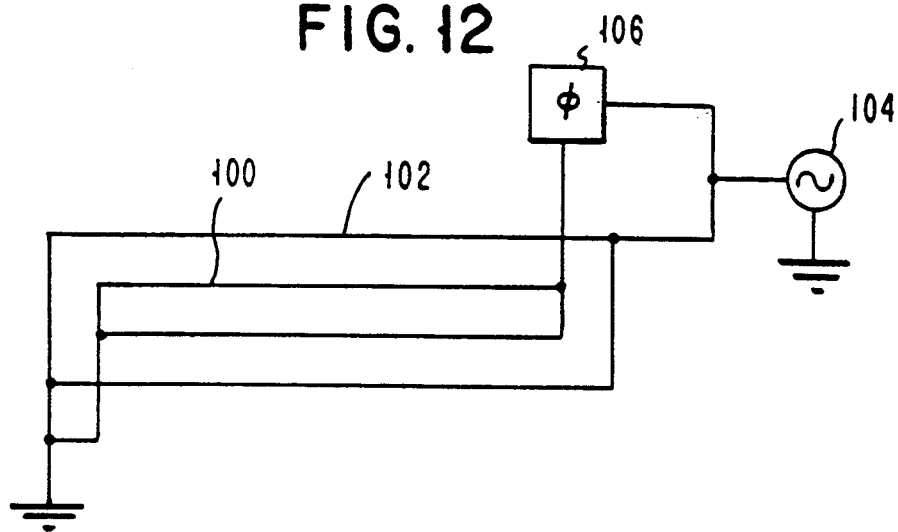
FIG. 12 is a schematic representation of a pair of nested coils in accordance with another embodiment of the present invention.

Referring now to FIG. 12, an alternate coil configuration is shown wherein a first coil 100 is nested within a second coil 102. As described in further detail below, this configuration allows elliptical or circular polarization of the RF electromagnetic fields. Both coils 100, 102 are shown diagrammatically, and are, for example, of substantially the same construction as coil 14 above. In accordance with this embodiment of the invention, coils 100, 102 are positioned at ninety-degree angles to one-another; that is, with the windings defining the major surfaces of each coil parallel but rotated ninety degrees to one-other. Each coil has one end connected to a system ground.

A source of RF energy 104 is connected to drive coil 102 directly, and to drive coil 100 through a phase-shifting circuit 106 which changes the phase of the RF energy by ninety degrees relative to the output of source 104. Thus, coil 100 is driven ninety degrees out of phase to coil 102. Many different configurations for phase-shifting circuits such as 106 are known in the art.

In operation, nested coils 100, 102 are straight-forwardly substituted for coil 14 in plasma system 10. The resulting electromagnetic field provided by this embodiment of the invention is not only very uniform but, due to the ninety-degree alignment of the coils and phase-shift of the driving energy, the electromagnetic field rotates about axis X within the system. This rotating electromagnetic field increases both the uniformity and rate of etch of the system.

It will be understood that, to obtain the benefits of this embodiment of the invention, the coils needn't be nested but could, alternatively, be stacked or interwoven. Further, instead of phase-shifting the RF power driving the coils, each coil can be powered by a separate RF power source where the frequency of each power source is slightly different. The end result is a uniform, rotating, polarized electromagnetic field.

In accordance with yet another embodiment of the present invention, with reference to system 10 of FIG. 1, impedance matching circuit 16 can be moved from the position shown, and a second processing chamber similar to chamber 12 substituted in its place. A second workpiece holder and workpiece can be positioned in the second chamber above and parallel to coil 14, whereby the system can be used to process two workpieces at the same time.

There is thus provided a new and improved RF plasma processing system, the system utilizing a coil having at least one major coil surface defined by parallel conductors and positioned parallel to the workpiece surface to be processed. The electromagnetic field resulting from such a system is very uniform over a region having generally the same cross-sectional shape as the coil major surface. Thus, the coil can be shaped to optimize the uniformity of the electromagnetic field by matching the major surface to the shape of the workpiece being processed. The resulting system provides highly uniform plasma processes, such as etching, deposition, and coating processes, in a highly compact and relatively simple system. More specifically, the system of the present invention does not require the multiple chambers or the magnetic pieces shown in the prior systems.

The present invention has application in the field of plasma processing, and particularly in the fields of etching and deposition on semiconductor wafers.

While the present invention has been described with respect to specific embodiments, numerous changes, modifications and improvements falling within the scope and spirit of the invention will occur to those skilled in the art.

What is claimed is:

1. A plasma processing apparatus comprising:
   a chamber for supporting a workpiece;
   means for introducing a gas into said chamber;
   a coil of conductive material disposed on said chamber and including at least one generally flattened surface defined by straight parallel conductors, said generally flattened surface positioned to overlie and be generally parallel to said workpiece when said workpiece is supported in said chamber; and
   means for applying radio frequency energy to said coil.

2. The apparatus of claim 1 wherein said coil is comprised of generally flat, strap-like material.

3. The apparatus of claim 1 wherein said coil includes a second flattened surface defined by parallel conductors and disposed generally parallel to the first flattened surface.

4. The apparatus of claim 3 wherein the conductors defining the first surface of said coil are generally parallel to the conductors defining the second surface of the coil.

5. The apparatus of claim 3 wherein the conductors defining the first and second surfaces of said coil are generally helical in configuration.

6. The apparatus of claim 3 and further including:
   a second coil having a generally flattened configuration whereby to provide a second pair of opposing, generally planar surfaces, said second coil positioned closely spaced to said first coil with the conductors defining said second coil generally at a ninety degree angle to the conductors defining said first coil; and
   means for providing RF energy to each of said first and second coils whereby to generate a rotating electromagnetic field.

7. The apparatus of claim 1 wherein said means for applying radio frequency energy to said coil includes:
   a source for generating said radio frequency energy; and
   an electrical circuit for coupling said radio frequency energy to said coil.

8. The plasma processing apparatus of claim 1 wherein the shape of said generally flattened surface of said coil is selected to match the shape of said workpiece.

9. A method of operating a plasma processing apparatus, said apparatus comprising a chamber for supporting a workpiece in a controlled pressure environment, and means for introducing a gas into said chamber, said method comprising the steps of:

placing a coil of conductive material, said coil including at least one generally flattened surface defined by straight parallel conductors, onto said chamber such that said generally flattened surface is positioned to overlie and be parallel to said workpiece when said workpiece is supported in said chamber; and applying radio frequency energy to said coil.

10. The method of claim 9 wherein said coil is comprised of generally flat, strap-like material.

11. The method of claim 10 and further including the steps of:

placing a second coil, said second coil having at least one generally flattened surface defined by parallel conductors, closely spaced to said first coil with the conductors defining said flattened surface of said second coil generally at a ninety degree angle to the conductors defining said flattened surface of said first coil; and applying RF energy to each of said first and second coils whereby to generate a rotating electromagnetic field.

12. The method of claim 9 wherein the shape of said generally flattened surface of said coil is selected to match the shape of said workpiece.

* * * * *